(12) United States Patent
Oshige

(10) Patent No.: US 12,402,499 B2
(45) Date of Patent: Aug. 26, 2025

(54) SEMICONDUCTOR DEVICE, LIGHT EMITTING DEVICE, DISPLAY DEVICE, PHOTOELECTRIC CONVERSION DEVICE, ELECTRONIC APPARATUS, ILLUMINATION DEVICE, AND MOVING BODY

(71) Applicant: CANON KABUSHIKI KAISHA, Tokyo (JP)

(72) Inventor: Hidemasa Oshige, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 148 days.

(21) Appl. No.: 18/295,277

(22) Filed: Apr. 4, 2023

(65) Prior Publication Data

US 2023/0337489 A1 Oct. 19, 2023

(30) Foreign Application Priority Data

Apr. 15, 2022 (JP) ................. 2022-067819

(51) Int. Cl.
| | |
|---|---|
| H10K 59/131 | (2023.01) |
| H04N 23/51 | (2023.01) |
| H04N 23/53 | (2023.01) |
| H04N 23/56 | (2023.01) |
| H04N 23/63 | (2023.01) |
| H10K 59/38 | (2023.01) |
| H10K 59/80 | (2023.01) |

(52) U.S. Cl.
CPC .......... *H10K 59/131* (2023.02); *H04N 23/51* (2023.01); *H04N 23/53* (2023.01); *H04N 23/56* (2023.01); *H04N 23/63* (2023.01); *H10K 59/38* (2023.02); *H10K 59/8792* (2023.02)

(58) Field of Classification Search
CPC .. H10K 59/131; H10K 59/38; H10K 59/8792; H10K 59/126; H04N 23/51; H04N 23/53; H04N 23/56; H04N 23/63
See application file for complete search history.

(56) References Cited

U.S. PATENT DOCUMENTS

| | | | |
|---|---|---|---|
| 2015/0348914 A1* | 12/2015 | Takazawa | H10F 39/809 257/435 |
| 2016/0204070 A1* | 7/2016 | Wu | H01L 29/66969 257/43 |
| 2017/0345863 A1* | 11/2017 | Hori | H10F 39/026 |
| 2020/0133054 A1* | 4/2020 | Oshige | G02F 1/136227 |
| 2021/0036030 A1* | 2/2021 | He | H01L 27/1244 |
| 2021/0066420 A1* | 3/2021 | Oshige | H10K 59/131 |
| 2021/0167133 A1* | 6/2021 | Nakata | F21V 3/00 |
| 2022/0131027 A1* | 4/2022 | Akimoto | H10H 20/018 |

(Continued)

FOREIGN PATENT DOCUMENTS

| | | | | |
|---|---|---|---|---|
| JP | 2013-058458 A | | 3/2013 | |
| WO | WO-2021053932 A1 * | | 3/2021 | ........... G03F 9/7076 |

*Primary Examiner* — Padma Haliyur
(74) *Attorney, Agent, or Firm* — Venable LLP

(57) ABSTRACT

A semiconductor device including an element substrate having a main surface provided with a pixel region where a plurality of pixels are arranged and a peripheral region where an alignment mark and a plurality of terminals are arranged, is provided. The semiconductor device further includes a transparent insulating layer configured to cover the alignment mark and not to cover the plurality of terminals and each portion between the plurality of terminals.

21 Claims, 10 Drawing Sheets

(56) References Cited

U.S. PATENT DOCUMENTS

2022/0384515 A1* 12/2022 Takata .................. H01L 21/768
2023/0024469 A1* 1/2023 Iwamoto ................ H01L 22/20
2023/0309361 A1    9/2023 Oshige

* cited by examiner

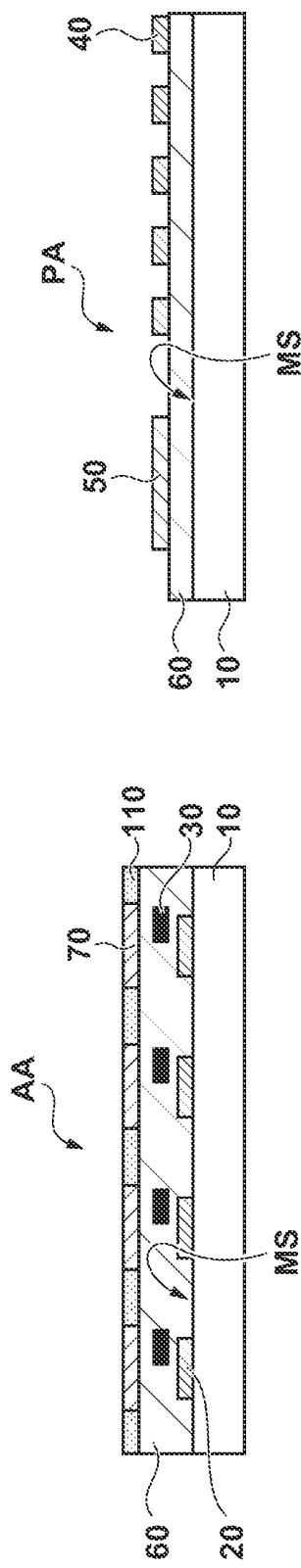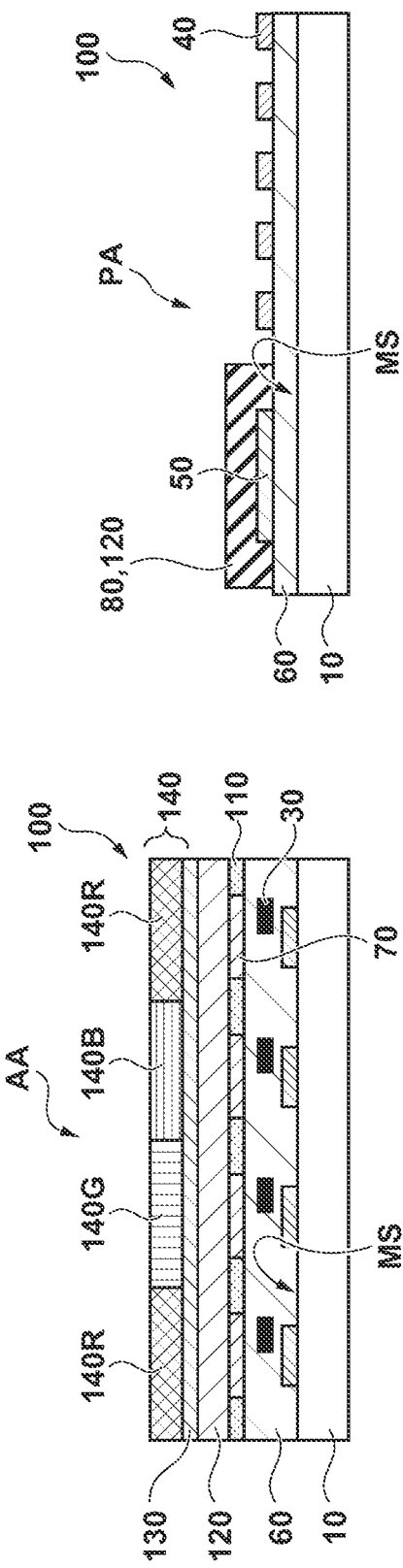

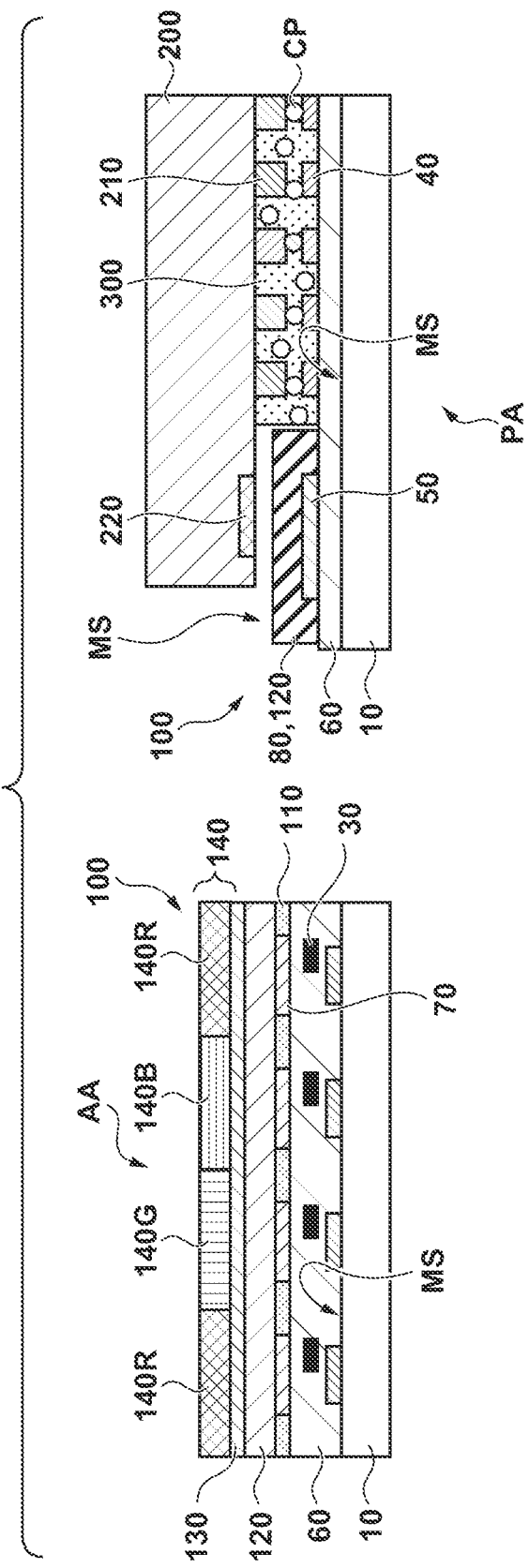

SEMICONDUCTOR DEVICE, LIGHT EMITTING DEVICE, DISPLAY DEVICE, PHOTOELECTRIC CONVERSION DEVICE, ELECTRONIC APPARATUS, ILLUMINATION DEVICE, AND MOVING BODY

BACKGROUND OF THE INVENTION

Field of the Invention

The present invention relates to a semiconductor device, a light emitting device, a display device, a photoelectric conversion device, an electronic apparatus, an illumination device, and a moving body.

Description of the Related Art

In a semiconductor device that performs image capturing or display and includes an element substrate on which a plurality of pixels and external connection terminals are arranged, the pitch between the external connection terminals arranged on the element substrate is decreased along with a reduction in size of the semiconductor device. To bond the external connection terminals arranged at the small pitch to terminals provided on a bonded member such as a wiring board, it is necessary to improve the accuracy of alignment between the element substrate and the bonded member. Japanese Patent Laid-Open No. 2013-058548 describes a technique of accurately bonding, to a bonded member, a semiconductor chip including a sealing resin layer that covers protruding electrodes and alignment marks.

SUMMARY OF THE INVENTION

Some embodiments of the present invention provide a technique advantageous in implementing more accurate alignment in order to reduce the size of a semiconductor device and to improve the reliability of the semiconductor device.

According to some embodiments, a semiconductor device including an element substrate having a main surface provided with a pixel region where a plurality of pixels are arranged and a peripheral region where an alignment mark and a plurality of terminals are arranged, comprising: a transparent insulating layer configured to cover the alignment mark and not to cover the plurality of terminals and each portion between the plurality of terminals, is provided.

According to some embodiments, a semiconductor device including an element substrate having a main surface provided with a pixel region where a plurality of pixels are arranged and a peripheral region where an alignment mark and a plurality of terminals are arranged, comprising: a light shielding member surrounding an outer edge of the alignment mark in orthogonal projection to the main surface, is provided.

Further features of the present invention will become apparent from the following description of exemplary embodiments (with reference to the attached drawings).

BRIEF DESCRIPTION OF THE DRAWINGS

FIGS. 2A to 2C are views showing a method of manufacturing the semiconductor device shown in FIGS. 1A and 1B;

DESCRIPTION OF THE EMBODIMENTS

Figure 1A:
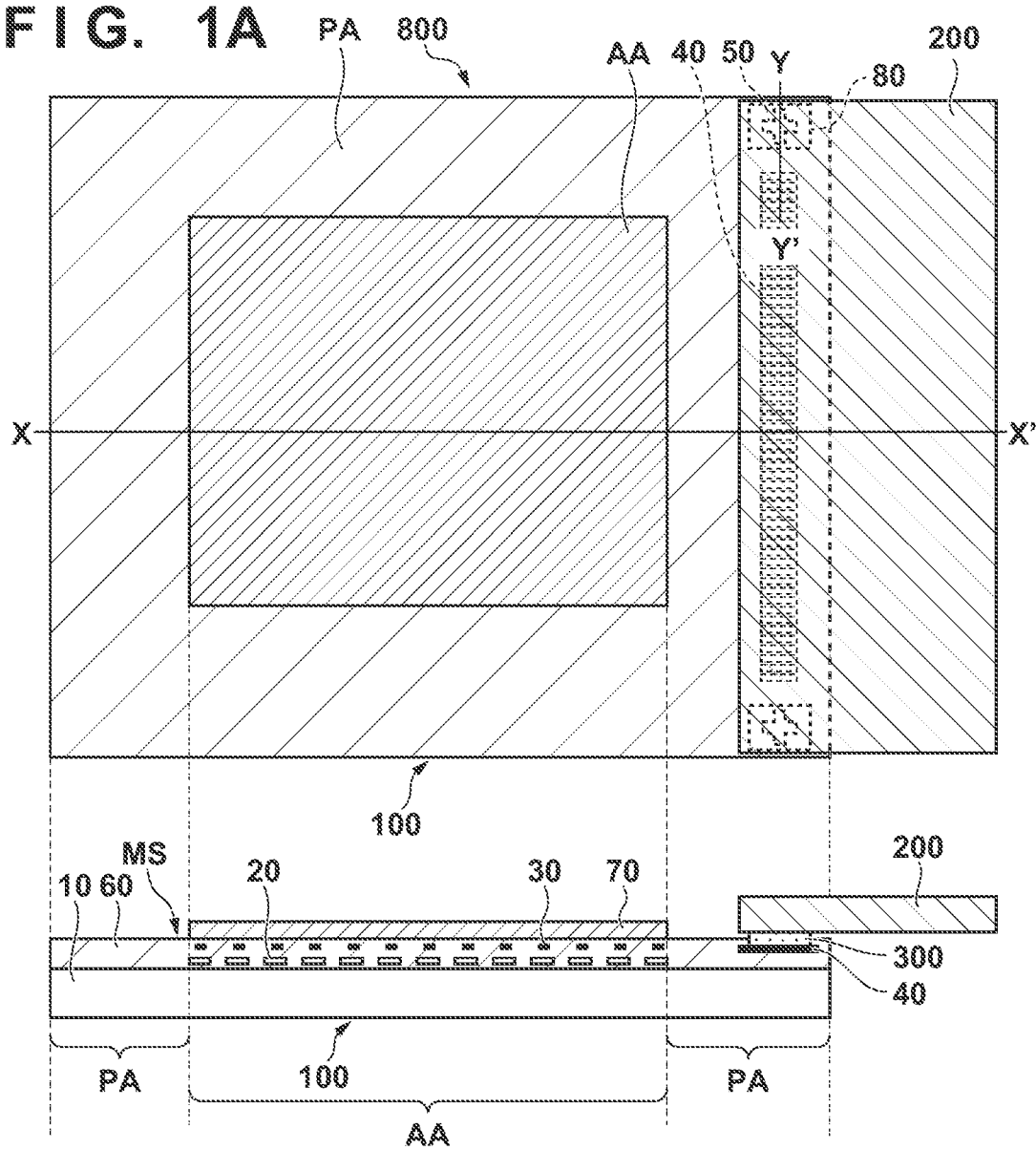
FIGS. 1A and 1B are views showing an example of the arrangement of a semiconductor device according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

In an arrangement shown in FIG. 1A, a pixel region AA has a rectangular shape. The diagonal length of the pixel region AA may be, for example, 5 to 50 mm. In a peripheral region PA, a circuit for operating pixels arranged in the pixel region AA can be arranged. If, for example, each of a plurality of pixels 70 includes a light emitting element and a semiconductor device 800 functions as a light emitting device, a driving circuit configured to drive each pixel 70 and a processing circuit such as a Digital-to-Analog Converter (DAC) configured to process a luminance signal input to each pixel 70 can be arranged in the peripheral region PA. If, for example, each of the plurality of pixels 70 includes a photoelectric conversion element, and the semiconductor device 800 functions as a photoelectric conversion device, a driving circuit configured to drive each pixel 70 and a processing circuit such as a Digital-to-Analog Converter (DAC) configured to process a signal to be output from each pixel 70 can be arranged in the peripheral region PA.

An example in which each pixel 70 includes a light emitting element such as an organic electroluminescent (EL) element and the semiconductor device 800 functions as a light emitting device will be exemplified below. However, the present invention is not limited to this, and a current-driven electro-optical element whose light emission luminance changes in accordance with the value of a current flowing through the element, such as an inorganic EL element, an LED element, or a semiconductor laser element may be used as the light emitting element. If the semiconductor device 800 functions as a light emitting device, the semiconductor device 800 may include an illumination device and a reflection element in a Digital Mirror Device (DMD) or a liquid crystal element in a Liquid Crystal Display (LCD) for controlling light emitted from the illumination device may be arranged as the pixel 70 in the pixel region AA, instead of the above-described self-light emitting element. Alternatively, as described above, each pixel 70 may include a photoelectric conversion element and the semiconductor device 800 may function as a photoelectric conversion device.

The peripheral region PA may be located outside the pixel region AA, and may include a region where non-effective pixels are provided. The non-effective pixel can be, for example, a dummy pixel. If the pixel 70 includes a light emitting element, the dummy pixel can be a pixel that emits no light, for example, a pixel that measures a current flowing through the dummy pixel. If, for example, the pixel 70 includes a photoelectric conversion element, the dummy pixel can be shielded from light. Therefore, the non-effective pixel can also be called a reference element, a test element, a monitor element, or the like.

Figure 1B:
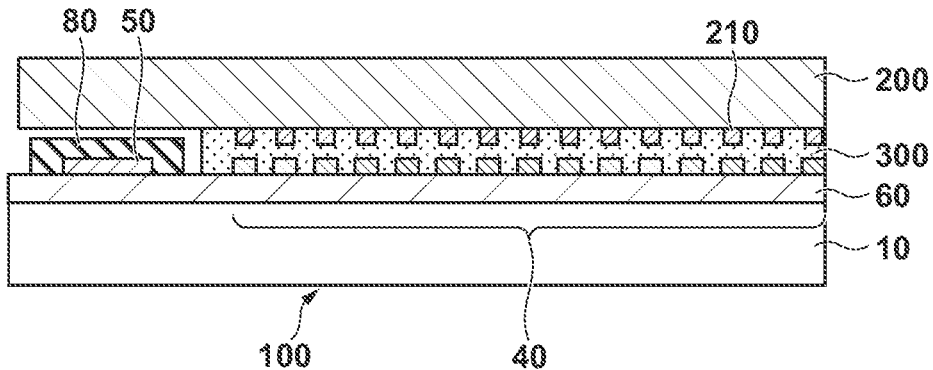

As shown in FIG. 1B, the semiconductor device 800 includes a wiring member 200 that includes a plurality of electrodes 210 respectively connected to a plurality of terminals 40, and a bonding member 300 arranged between the plurality of terminals 40 and the plurality of electrodes 210. An alignment mark 50 arranged in the peripheral region PA is used for alignment when connecting the plurality of terminals 40 and the plurality of electrodes 210. FIG. 1A shows the alignment mark 50 as a cross pattern but an arbitrary pattern such as a rectangular pattern or a circle pattern can be used. If an element substrate 100 is connected to an external power supply or control device via the wiring member 200, the semiconductor device 800 can operate.

A transparent insulating layer 80 is arranged on the alignment mark 50. The transparent insulating layer 80 covers the alignment mark 50 and does not cover the plurality of terminals 40 and each portion between the plurality of terminals 40. The transparent insulating layer 80 will be described in detail later.

Semiconductor elements 20, wiring patterns 30, an interlayer insulating layer 60, and the pixels 70 are arranged in the pixel region AA of the element substrate 100. The terminals 40, the alignment mark 50, a peripheral circuit (not shown), and the like are arranged in the peripheral region PA of the element substrate 100. A substrate 10 of the element substrate 100 can be a semiconductor substrate made of single-crystal silicon or the like. Each semiconductor element 20 is a transistor or a diode, and at least part of it can be arranged in the substrate 10. The wiring patterns 30 can include patterns arranged in a single wiring layer or multiple wiring layers using a conductor such as aluminum or copper, and via plugs or contact plugs that connect the wiring layers or the semiconductor elements 20 and the wiring patterns arranged in the wiring layer. When forming the wiring patterns 30 arranged in one wiring layer, the terminals 40 may be formed together. It can also be said that the terminals 40 and at least some of the wiring patterns 30 are arranged in the same wiring layer. The interlayer insulating layer 60 can contain silicon oxide, silicon nitride, silicon carbide, or the like. Note that silicon oxynitride and silicon carbonitride contain nitrogen and silicon as main elements, and thus are regarded as kinds of silicon nitride.

The plurality of pixels 70 are arranged in the pixel region AA of the element substrate 100. Although the pixels 70 are integrally shown in FIG. 1A, each pixel 70 includes a light emitting element and emits light with arbitrary luminance.

Each pixel 70 is connected to the wiring pattern 30 via the via provided in the interlayer insulating layer 60, and is electrically connected to the semiconductor element 20 via the wiring pattern 30. Although not shown in FIG. 1A, a passivation film for suppressing permeation of water, oxygen, or the like, a color filter layer, a lens structure, and the like can appropriately be provided on the pixels 70. A light-transmitting counter substrate using glass or acrylic may appropriately be arranged on the element substrate 100 to cover at least the pixel region AA.

The transparent insulating layer 80, the alignment mark 50, and the terminals 40 will be described in detail next with reference to FIG. 1B. In the peripheral region PA, a region where the alignment mark 50 and the terminals 40 are arranged will sometime be referred to as a terminal region hereinafter. The terminals 40, the interlayer insulating layer 60, and the alignment mark 50 are provided in the terminal region of the element substrate 100, and the transparent insulating layer 80 is provided on the alignment mark 50. The transparent insulating layer 80 is not arranged on the terminals 40 or between the terminals 40. As will be described later, an alignment error can be reduced by not arranging the transparent insulating layer 80 on the terminals 40 or between the terminals 40. The transparent insulating layer 80 may be made of a transparent inorganic material such as silicon oxide, silicon nitride, or aluminum oxide. Alternatively, the transparent insulating layer 80 may be made of a transparent resin material such as acrylic resin, epoxy resin, or silicone resin.

The electrodes 210 provided on the surface side, facing the element substrate 100, of the wiring member 200 are electrically bonded to the terminals 40 via the bonding member 300. The wiring member 200 may be a wiring board such as a rigid board or a flexible board. For example, the wiring member 200 is a flexible printed circuit such as a glass epoxy board or polyimide film in which the wiring patterns are provided, and the electrodes 210 using copper or the like are arranged on the main surface of the flexible printed circuit. In the wiring member 200, a driving circuit chip for operating the pixel region AA or the like may be arranged. The bonding member 300 can be a conductive member such as solder or an anisotropic conductive film (ACF). In the arrangement shown in FIG. 1i, an example of using the ACF as the bonding member 300 is shown. Furthermore, if the terminals 40 of the element substrate 100 and the terminal of the above-described driving circuit chip or the like are electrically bonded using a wire made of gold or the like, the wiring member 200 and the bonding member 300 are included in this wire.

In this embodiment, as shown in FIG. 1B, the transparent insulating layer 80 is arranged only on the alignment mark 50 and on the periphery of the alignment mark 50 not to cover the upper surface of each terminal 40 and each portion between the terminals 40. The surface of each terminal 40 protrudes from the surface of the interlayer insulating layer 60. That is, in the terminal region facing the electrodes 210 of the wiring member 200 in the element substrate 100, the surfaces of the terminals 40 protrude most. For example, in ACF bonding, conductive particles in a resin binder are sandwiched and compression-bonded between the terminals 40 and the electrodes 210 of the wiring member 200, and thus the terminals 40 and the electrodes 210 are electrically bonded.

At this time, as described in Japanese Patent Laid-Open No. 2013-058548, if the transparent insulating layer 80 is arranged between the terminals 40, the transparent insulating layer 80 makes it easy to uniformly apply a pressure to the entire terminal region. That is, a pressure is difficult to be applied between the terminals 40 of the element substrate 100 and the electrodes 210 of the wiring member 200. Furthermore, the electrodes 210 of the wiring member 200 ride on (contact) the transparent insulating layer 80 covering each portion between the terminals 40, and thus a failure in bonding easily occurs. For example, a stress acting between the electrode 210 and the transparent insulating layer 80 contacting the electrode 210 may make impossible to correctly align the electrode 210 of the wiring member 200 with the corresponding terminal 40. On the other hand, in this embodiment, the transparent insulating layer 80 does not cover the terminals 40 and each portion between the terminals 40. Therefore, the surfaces of the terminals 40 protrude, and the terminals 40 can locally apply a pressure to the bonding member 300, thereby improving the reliability of electrical bonding between the terminals 40 and the electrodes 210. An alignment deviation caused by the electrodes 210 contacting the transparent insulating layer 80 is also suppressed. As a result, it is possible to suppress occurrence of a failure in electrical bonding between the terminals 40 of the element substrate 100 and the electrodes 210 of the wiring member 200.

Furthermore, the transparent insulating layer 80 covers the alignment mark 50. In a manufacturing step of the semiconductor device 800, the alignment mark 50 may be exposed to a chemical solution in a development step, a photoresist separation step, or the like. In a dry etching step or an ashing step, the alignment mark 50 may be exposed to a reactive gas in plasma. Thus, by covering the alignment mark 50 with the transparent insulating layer 80, it is possible to suppress deterioration or damage of the alignment mark 50 in the manufacturing step of the semiconductor device 800. That is, in an alignment step when, for example, connecting the element substrate 100 and the wiring member 200, occurrence of an alignment error such as a situation in which the alignment mark 50 deteriorates and is thus not recognized is suppressed. Since the alignment mark 50 is not damaged, the shape of the alignment mark 50 is maintained, thereby making it possible to accurately perform alignment.

As described above, the transparent insulating layer 80 covers the alignment mark 50 and does not cover the plurality of terminals 40 and each portion between the plurality of terminals 40. This can suppress a failure in bonding and improve the accuracy of alignment between the element substrate 100 and the wiring member 200 when manufacturing the semiconductor device 800. As a result, it is possible to improve the reliability of the semiconductor device 800.

A method of manufacturing the semiconductor device 800 will be described next with reference to FIGS. 2A to 2C. As an example, a method of manufacturing the semiconductor device 800 functioning as a light emitting device in which an organic EL element is arranged in each pixel 70 will be described. FIGS. 2A to 2C each show a sectional view of the pixel region AA and the terminal region of the peripheral region PA.

FIG. 2A shows a section when a step of forming the light emitting elements of the pixels 70 of the element substrate 100 is complete. First, the semiconductor elements 20 such as transistors are formed on the substrate 10 using a semiconductor such as silicon. A main surface MS of the element substrate 100 is defined as a surface of the substrate 10 on which the semiconductor elements 20 and the pixels 70 are formed. In the element substrate 100, each component is arranged on the main surface (main surface MS) of the substrate 10 and the main surface (main surface MS) of the substrate 10 can serve as a reference when arranging each component. The semiconductor elements 20 are formed at least in the pixel region AA. Next, the interlayer insulating layer 60 is formed on the substrate 10 and the semiconductor elements 20. For the interlayer insulating layer 60, silicon oxide, silicon nitride, silicon carbide, or the like is used. The interlayer insulating layer 60 is provided not only in the pixel region AA but also in the peripheral region PA. In the interlayer insulating layer 60, the contact plugs electrically connected to the semiconductor elements 20 are arranged. For the contact plug, a conductive member such as tungsten can be used. In the interlayer insulating layer 60, the wiring patterns 30 electrically connected to the semiconductor elements 20 via the contact plugs are provided. For the wiring pattern 30, for example, a metal such as aluminum or copper is used. In this case, to suppress metal diffusion to the interlayer insulating layer 60, a barrier layer using titanium, tantalum, titanium nitride, tantalum nitride, or the like may be provided in the interface between the interlayer insulating layer 60 and the wiring patterns 30.

In the peripheral region PA of the element substrate 100, the terminals 40 and the alignment mark 50 can be formed in the same layer as one of the wiring layers in which the wiring patterns 30 are arranged. At the stage shown in FIG. 2A, the interlayer insulating layer 60 covering the terminals 40 and the alignment mark 50 is removed, and the terminals 40 and the alignment mark 50 are exposed. If the alignment mark 50 is formed simultaneously with the wiring pattern 30, a low reflective material such as titanium nitride used for the barrier layer may remain on the uppermost surface of the alignment mark 50, and thus the visibility of the alignment mark 50 may deteriorate. To improve the visibility of the alignment mark 50, after the alignment mark 50 is formed simultaneously with the wiring pattern 30, the interlayer insulating layer 60 covering the alignment mark 50 is etched. Next, the barrier layer such as titanium nitride on the alignment mark 50 may be removed.

In the pixel region AA, the pixels 70 each including the organic EL element are provided on the interlayer insulating layer 60. The pixels 70 can electrically be connected to the wiring patterns 30. In addition, the pixels 70 can electrically be connected to the semiconductor elements 20. The organic EL element included in each pixel 70 can include a pixel electrode, a counter electrode, and an organic light emitting layer arranged between the pixel electrode and the counter electrode. For example, the organic light emitting layer may emit white light. A pixel separation layer 110 may be arranged between the adjacent pixels 70 to suppress a short between the organic EL elements caused by the step between the pixel electrodes. To readily inject and transport holes from the pixel electrode, a hole injection layer and a hole transport layer may be formed between the organic light emitting layer and the pixel electrode. Furthermore, to readily inject and transport electrons from the counter electrode, an electron transport layer and an electron injection layer may be formed between the organic light emitting layer and the counter electrode.

FIG. 2B shows the section of the element substrate 100 before the alignment step of electrically connecting the element substrate 100 and the wiring member 200. A sealing layer 120 for suppressing permeation of water to the organic EL element is formed on the pixels 70. In this embodiment, by providing, on the alignment mark 50 arranged in the peripheral region PA, the sealing layer 120 arranged on the pixels 70, the sealing layer 120 is used as the transparent insulating layer 80. It can also be said that the transparent insulating layer 80 covers not only the alignment mark 50 but also the plurality of pixels 70. By forming the transparent insulating layer 80 and the sealing layer 120 at the same time, it is possible to form the transparent insulating layer 80 to cover the alignment mark 50 without adding any step.

An arbitrary material can be used as the sealing layer 120 and the transparent insulating layer 80 as long as it is a transparent inorganic insulating film. In this embodiment, silicon nitride is used for the sealing layer 120 and the transparent insulating layer 80 and a film thickness is 1.5 μm. The transmittance of each of the sealing layer 120 and the transparent insulating layer 80 may be, for example, 80% or more in a visible light wavelength range (400 to 650 nm), and may be 90% or more to improve the visibility of the alignment mark 50.

If the sealing layer 120 has a large film thickness, the visibility of the alignment mark 50 may deteriorate. In this case, the sealing layer 120 on the alignment mark 50 may be etched and thinned, thereby obtaining the transparent insulating layer 80. For example, if a plurality of sealing layers 120 are arranged to cover the plurality of pixels 70, the upper layers may be etched while keeping only one layer abutting against the alignment mark 50 among the plurality of sealing layers 120, thereby obtaining the transparent insulating layer 80. It can also be said that the transparent insulating layer 80 forms one layer among the plurality of sealing layers 120. This can suppress the decrease in transmittance of the transparent insulating layer 80 in the visible light wavelength region.

Next, a resin planarizing layer 130 is formed on the sealing layer 120. In FIG. 2B, the upper surface of the sealing layer 120 is flat. However, there is unevenness of the pixel separation layer 110 and the organic EL elements between the pixels 70. To improve the patterning accuracy in a step of forming a color filter layer (to be described later), the resin planarizing layer 130 is formed to planarize unevenness of the upper surface of the sealing layer 120. An arbitrary resin material can be used for the resin planarizing layer 130 as long as the material is transparent. In this embodiment, the resin planarizing layer 130 is formed using a UV-curable acrylic resin in the pixel region AA and the peripheral region PA except for the terminal region. The film thickness of the resin planarizing layer 130 may be, for example, about 0.5 km.

A color filter layer 140 (to also be referred to as a colored layer hereinafter) for covering the plurality of pixels 70 is arranged on the resin planarizing layer 130. As described above, if a step using insulating films simultaneously formed in the sealing layer 120 and the transparent insulating layer 80 is adopted, it can also be said that the transparent insulating layer 80 is arranged between the plurality of pixels 70 and the color filter layer 140. The color filter layer 140 includes color filters of a plurality of colors. For example, a red color filter 140R that transmits red light, a green color filter 140G that transmits green light, and a blue color filter 140B that transmits blue light may be included. In this embodiment, the organic EL element arranged in each pixel 70 emits white light and the RGB color filter layer 140 is arranged for each pixel 70, thereby implementing color display. A lens structure for improving the light extraction efficiency and the like may additionally be provided on the color filter layer 140.

FIG. 2C shows a section when the element substrate 100 and the wiring member 200 are bonded via the bonding member 300. As shown in FIG. 2C, in the terminal region of the peripheral region PA of the element substrate 100, the terminals 40 of the element substrate 100 and the electrodes 210 of the wiring member 200 are electrically bonded via the bonding member 300. In this embodiment, a flexible printed circuit is used as the wiring member 200 and an ACF tape is used as the bonding member 300. After the surface of the wiring member 200 on which the electrodes 210 are formed is made to face the element substrate 100, and the alignment mark 50 arranged in the element substrate 100 and an alignment mark 220 arranged in the wiring member 200 are used to perform alignment, the electrodes 210 of the wiring member 200 and the terminals 40 of the element substrate 100 are thermocompression-bonded via the bonding member 300. At this time, the thermocompression bonding temperature may be set to 100° C. so the organic EL elements arranged in the pixels 70 do not deteriorate due to the heat. The bonding member 300 contains conductive particles CP in the epoxy resin binder, and the conductive particles CP are sandwiched between the electrodes 210 of the wiring member 200 and the terminals 40 of the element substrate 100, thereby electrically bonding the electrodes 210 and the terminals 40. By including the above steps, the semiconductor device 800 functioning as the light emitting device of this embodiment is completed.

In this embodiment, in the terminal region arranged in the peripheral region PA of the element substrate 100, the transparent insulating layer 80 covers the upper surface of the alignment mark 50 and does not cover the upper surface of each terminal 40 and each portion between the terminals 40. Therefore, electrical bonding by compression bonding between the terminals 40 of the element substrate 100 and the electrodes 210 of the wiring member 200 is implemented more reliably. Furthermore, it is possible to suppress a failure in bonding caused when the electrodes 210 of the wiring member 200 ride on the transparent insulating layer 80 arranged between the terminals 40.

As shown in FIG. 2C, the transparent insulating layer 80 and the bonding member 300 may be arranged not to overlap each other in orthogonal projection to the main surface MS of the element substrate 100. If the bonding member 300 is formed not to be superimposed on the transparent insulating layer 80, it is possible to suppress occurrence of a crack in the transparent insulating layer 80 caused by the conductive particles CP contained in the ACF at the time of thermocompression bonding. Furthermore, the resin binder of the ACF is softened during thermocompression bonding to extend in the outer peripheral direction (the horizontal direction in FIG. 2C). However, the resin binder of the ACF can be blocked by the transparent insulating layer 80, thereby suppressing the resin binder from unnecessarily extending outside.

As described above, in this embodiment, the sealing layer 120 is also formed on the alignment mark 50 and used as the transparent insulating layer 80. However, the present invention is not limited to this. For example, the resin planarizing layer 130 may be formed on the alignment mark 50 and used as the transparent insulating layer 80. In this case, the transparent insulating layer 80 is made of a resin material.

As described above, according to this embodiment, by covering the alignment mark 50 with the transparent insulating layer 80, deterioration or damage of the alignment mark 50 in the manufacturing step is suppressed, thereby preventing a situation in which the alignment mark 50 is not recognized and an alignment error occurs. Furthermore, by not arranging the transparent insulating layer 80 on the terminals 40 and in each portion between the terminals 40, it is possible to accurately bond the element substrate 100 and the wiring member 200 with high quality. This can improve the reliability of the semiconductor device 800 while coping with a decrease in pitch between the terminals 40 along with a reduction in size of the semiconductor device 800.

Figure 3A:
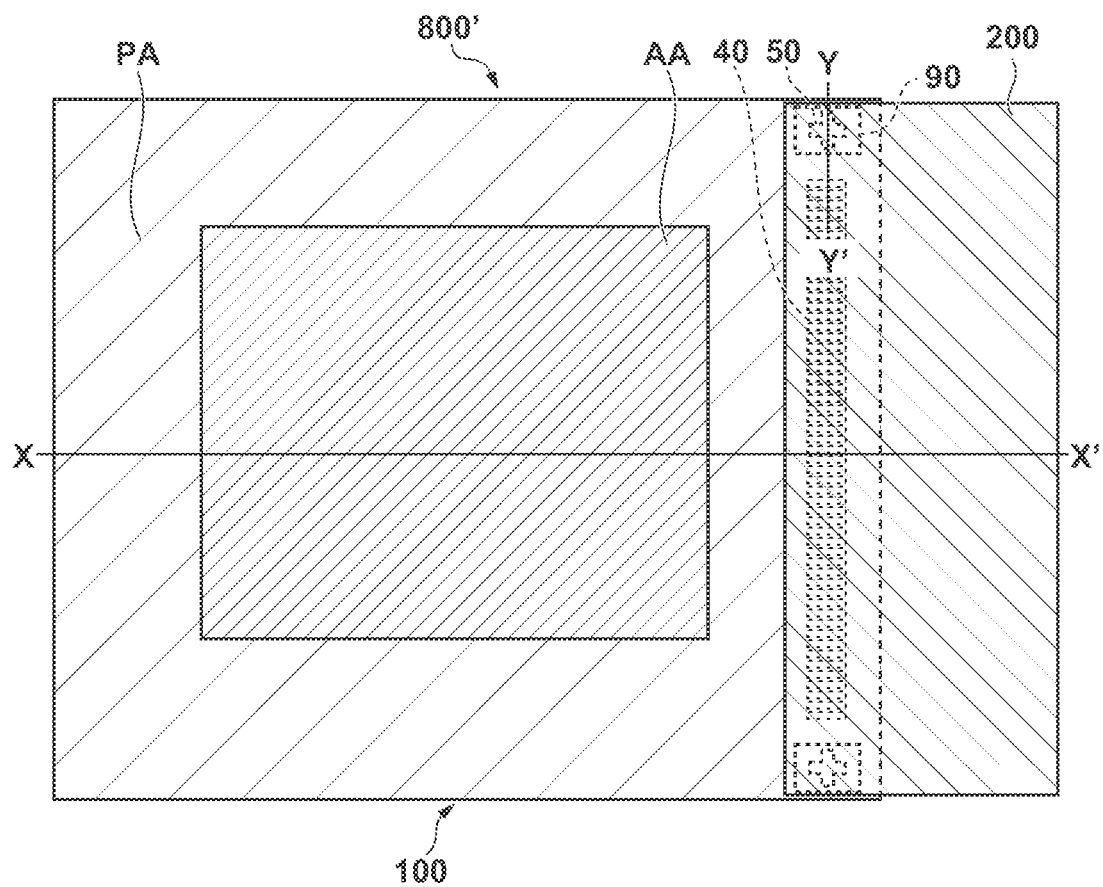
FIGS. 3A and 3B are views showing a modification of the semiconductor device shown in FIGS. 1A and 1B.
Figure 3B:
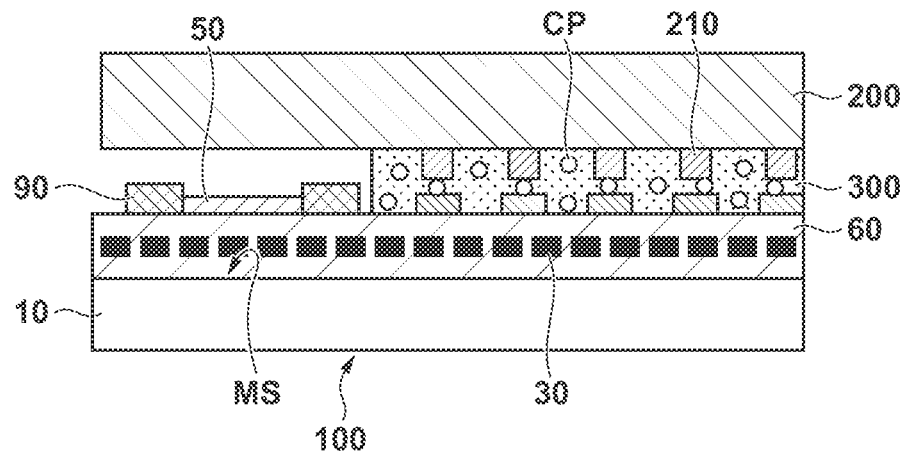

A modification of the element substrate 100 of the semiconductor device 800 will be described next with reference to FIGS. 3A and 3B. FIG. 3A is a plan view of a semiconductor device 800', and FIG. 3B is a sectional view taken along a line Y-Y' in FIG. 3A. The semiconductor device 800' includes a light shielding member 90 to surround the outer edge of the alignment mark 50 in orthogonal projection to the main surface MS of the element substrate 100. The semiconductor device 800' is different from the above-described semiconductor device 800 in that the alignment mark 50 is not covered with the transparent insulating layer 80. The remaining components of the semiconductor device 800' may be the same as those of the semiconductor device 800 and the different point will mainly be described below.

In the above description, the transparent insulating layer 80 covers the alignment mark 50 so the alignment mark 50 arranged in the element substrate 100 is not exposed to a chemical solution or a reactive gas in the step of manufacturing the element substrate 100 (semiconductor device 800). However, depending on the manufacturing step of the element substrate 100 (semiconductor device 800), the alignment mark 50 is not always exposed to a chemical solution or a reactive gas. For example, a case is considered in which after forming the alignment mark 50, no step of exposing the alignment mark 50 to a chemical solution or a reactive gas is provided. Furthermore, for example, there is a case in which a chemical solution or a reactive gas used in a step after forming the alignment mark 50 does not degrade the alignment mark 50. For example, there is also a case in which a step of removing the transparent insulating layer 80 before the element substrate 100 and the wiring member 200 are bonded is included. In this case, as shown in FIG. 3B, the alignment mark 50 may be exposed. In addition, the alignment mark 50 may be covered with the transparent insulating layer 80 and the light shielding member 90 may also be arranged, as will be described later with reference to FIGS. 4A to 4C.

As shown in FIGS. 3A and 3B, in the terminal region of the peripheral region PA, the terminals 40 and the alignment mark 50 are provided on the interlayer insulating layer 60, and the light shielding member 90 is provided to surround the outer periphery of the alignment mark 50. The light shielding member 90 does not cover the plurality of terminals 40 and each portion between the plurality of terminals 40.

In the alignment step when bonding the element substrate 100 and the wiring member 200, the alignment mark 50 provided in the element substrate 100 is irradiated with illumination light such as white light. Next, the alignment mark 50 is recognized using a CCD camera or the like based on the difference (contrast) in reflected light between the alignment mark 50 and the periphery of the alignment mark 50. If the difference in reflected light between the alignment mark 50 and the periphery of the alignment mark 50 is small, the edge of the alignment mark 50 cannot be detected correctly, causing an alignment deviation or an alignment error.

The interlayer insulating layer 60 can be made of a light-transmitting inorganic material. Therefore, the visibility of the alignment mark 50 may deteriorate due to reflected light from the substrate 10 (for example, a silicon substrate) on the periphery of the alignment mark 50.

In the peripheral region PA, the plurality of wiring patterns 30 may be arranged in a layer between the main surface MS of the element substrate 100 and the alignment mark 50. More specifically, if the copper wiring patterns 30 are formed using a damascene process, when a difference in density between the wiring patterns 30 is large in the substrate plane, a failure such as dishing or erosion may occur in a Chemical Mechanical Polishing (CMP) step. To suppress dishing or erosion, the wiring patterns 30 may be arranged in the interlayer insulating layer 60 also in the terminal region of the peripheral region PA, as shown in FIG. 3B. The wiring patterns 30 arranged in the terminal region of the peripheral region PA may be dummy patterns for suppressing dishing or erosion. With the wiring patterns 30 arranged in the terminal region of the peripheral region PA, the periphery of the alignment mark 50 receives reflected light from the wiring patterns 30 in addition to reflected light from the substrate 10, thereby decreasing the visibility of the alignment mark 50.

In this embodiment, the light shielding member 90 having a light shielding property is arranged to surround the periphery of the alignment mark 50. This can suppress reflected light from the substrate 10 and reflected light from the wiring patterns 30. As a result, the visibility of the alignment mark 50 is improved, thereby making it possible to suppress an alignment error and improve the accuracy of alignment with respect to the wiring member 200. As a result, it is possible to improve the reliability of the semiconductor device 800'.

Figure 4A:
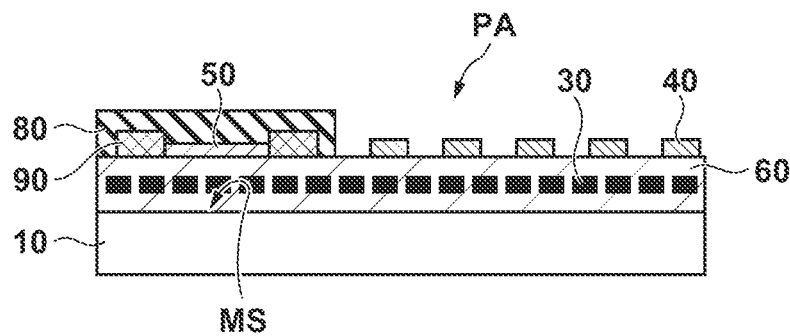
FIGS. 4A to 4C are views each showing a modification of the semiconductor device shown in FIGS. 3A and 3B.
Figure 4B:
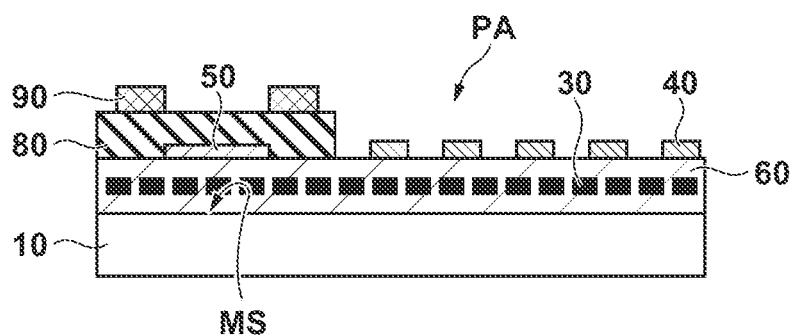
Figure 4C:
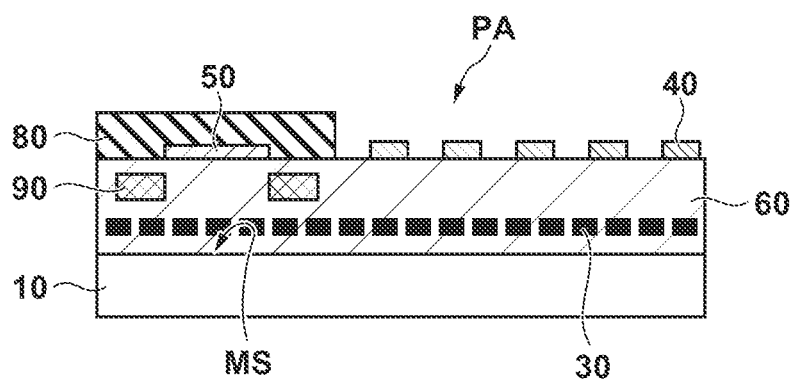

FIGS. 4A to 4C each show a modification of the sectional view of the terminal region of the peripheral region PA of the element substrate 100. As shown in FIG. 4A, the above-described transparent insulating layer 80 may be arranged to cover the alignment mark 50 and not to cover the plurality of terminals 40 and each portion between the plurality of terminals 40. In this case, as shown in FIG. 4A, the light shielding member 90 may be covered with the transparent insulating layer 80. This is an effective structure if the alignment mark 50 is exposed to a chemical solution or a reactive gas to deteriorate or to be damaged in the manufacturing step of the semiconductor device 800'. With the arrangement shown in FIG. 4A, a decrease in light shielding property caused by deterioration or damage of the light shielding member 90 can be suppressed.

If, for example, a step in which deterioration or damage of the light shielding member 90 is suppressed can be used in the manufacturing step of the semiconductor device 800', the light shielding member 90 may be formed on the transparent insulating layer 80, as shown in FIG. 4B. In other words, the transparent insulating layer 80 may be arranged in a layer between the alignment mark 50 and the light shielding member 90. In the arrangement shown in FIG. 4B, for example, the alignment mark 50 may be covered with the transparent insulating layer 80 immediately after forming the alignment mark 50. In this case, it is possible to minimize deterioration or damage of the alignment mark 50 in the manufacturing step. As will be described later, if the color filter layer 140 is used as the light shielding member 90 and the resin planarizing layer 130 is used as the transparent insulating layer 80, the structure shown in FIG. 4B can be obtained by sequentially forming the resin planarizing layer 130 and the color filter layer 140 without adding any step.

As shown in FIG. 4C, the light shielding member 90 may be arranged in a layer between the main surface MS of the element substrate 100 and the alignment mark 50. Since the light shielding member 90 is provided in the interlayer insulating layer 60, a material usable for the light shielding member 90 is limited. For example, a low reflective material such as titanium nitride used for the above-described barrier layer can be used for the light shielding member 90.

For the light shielding member 90, an arbitrary low reflective material having a light shielding property can be used. For example, the light shielding member 90 may contain a black resin containing carbon black, or titanium nitride used for the color filter layer 140 and the barrier layer. A material suitable for the manufacturing step of each component shown in FIGS. 3A, 3B, and 4A to 4C may appropriately be selected. The respective materials may be used in combination. For example, a black resin may be arranged at the position shown in FIG. 4A, any of the color filters used for the color filter layer 140 may be arranged at the position shown in FIG. 4B, and titanium nitride used for the barrier layer may additionally be arranged at the position shown in FIG. 4C.

A case in which the color filter layer 140 is used as the light shielding member 90 will now be described. As described above, the color filter layer 140 includes color filters of a plurality of colors. At this time, color filters of one or more colors among the color filters of the plurality of colors may function as the light shielding member 90. For example, in the color filter layer 140, the color filter which is most difficult to be visually perceived is the blue color filter 140B. Therefore, the light shielding member 90 may include the blue color filter 140B that transmits blue light, among the color filters of the plurality of colors. The color filters of the plurality of colors may be stacked to obtain a color closer to black. For example, by stacking the blue color filter 140B and the red color filter 140R, the light shielding member 90 closer to black can be formed. Furthermore, the color filters of three colors of R, G, and B may be stacked.

As described above, by providing the light shielding member 90 to surround the periphery of the alignment mark 50, the visibility of the alignment mark 50 is improved. By combining the transparent insulating layer 80 and the light shielding member 90, it is possible to suppress a situation in which it becomes difficult to recognize the alignment mark 50 due to deterioration or damage during manufacturing. This can improve the accuracy of alignment between the element substrate 100 and the wiring member 200 and suppress a failure in bonding between the element substrate 100 and the wiring member 200 when manufacturing the semiconductor device 800. As a result, it is possible to improve the reliability of the semiconductor device 800.

Application examples in which the semiconductor device 800 or 800' of this embodiment in which the organic EL element is arranged as a light emitting element in each pixel 70 and which functions as the light emitting device is applied to a display device, a photoelectric conversion device, an electronic apparatus, an illumination device, a moving body, and a wearable device will be described here with reference to FIGS. 5 to 11A and 11B. Details of the components of the above-described semiconductor device 800 or 800' functioning as the light emitting device and modifications will be described first, and the application examples will be described after that.

Arrangement of Organic Light Emitting Element

The organic light emitting element is provided by forming an insulating layer, a first electrode, an organic compound layer, and a second electrode on a substrate. A protection layer, a color filter, a microlens, and the like may be provided on a cathode. If a color filter is provided, a planarizing layer can be provided between the protection layer and the color filter. The planarizing layer can be made of acrylic resin or the like. The same applies to a case in which a planarizing layer is provided between the color filter and the microlens.

Substrate

Quartz, glass, a silicon wafer, a resin, a metal, or the like may be used as a substrate. Furthermore, a switching element such as a transistor and a wiring may be provided on the substrate, and an insulating layer may be provided thereon. The insulating layer may be made of any material as long as a contact hole can be formed so that the wiring can be formed between the insulating layer and the first electrode and insulation from the unconnected wiring can be ensured. For example, a resin such as polyimide, silicon oxide, silicon nitride, or the like can be used.

Electrode

A pair of electrodes can be used as the electrodes. The pair of electrodes can be an anode and a cathode. If an electric field is applied in the direction in which the organic light emitting element emits light, the electrode having a high potential is the anode, and the other is the cathode. It can also be said that the electrode that supplies holes to the light emitting layer is the anode and the electrode that supplies electrons is the cathode.

As the constituent material of the anode, a material having a work function as large as possible may be used. For example, a metal such as gold, platinum, silver, copper, nickel, palladium, cobalt, selenium, vanadium, or tungsten, a mixture containing some of them, an alloy obtained by combining some of them, or a metal oxide such as tin oxide, zinc oxide, indium oxide, indium tin oxide (ITO), or zinc indium oxide can be used. Furthermore, a conductive polymer such as polyaniline, polypyrrole, or polythiophene can also be used.

One of these electrode materials may be used singly, or two or more of them may be used in combination. The anode may be formed by a single layer or a plurality of layers.

If the anode is used as a reflective electrode, for example, chromium, aluminum, silver, titanium, tungsten, molybdenum, an alloy thereof, a stacked layer thereof, or the like can be used. The above materials can function as a reflective film having no role as an electrode. If the anode is used as a transparent electrode, an oxide transparent conductive layer made of indium tin oxide (ITO), indium zinc oxide, or the like can be used, but the present invention is not limited thereto. A photolithography technique can be used to form the electrode.

On the other hand, as the constituent material of the cathode, a material having a small work function may be used. Examples of the material include an alkali metal such as lithium, an alkaline earth metal such as calcium, a metal such as aluminum, titanium, manganese, silver, lead, or chromium, and a mixture containing some of them. Alternatively, an alloy obtained by combining these metals can also be used. For example, a magnesium-silver alloy, an aluminum-lithium alloy, an aluminum-magnesium alloy, a silver-copper alloy, a zinc-silver alloy, or the like can be used. A metal oxide such as indium tin oxide (ITO) can also be used. One of these electrode materials may be used singly, or two or more of them may be used in combination. The cathode may have a single-layer structure or a multilayer structure. Among others, silver is suitable for use. To suppress aggregation of silver, a silver alloy is more suitable for use. The ratio of the alloy is not limited as long as aggregation of silver can be suppressed. For example, the ratio between silver and another metal may be 1:1, 3:1, or the like.

The cathode may be a top emission element using an oxide conductive layer made of ITO or the like, or may be a bottom emission element using a reflective electrode made of aluminum (Al) or the like, and is not particularly limited. The method of forming the cathode is not particularly limited, but direct current sputtering or alternating current sputtering is suitable since the good film coverage is provided and the resistance is easily lowered.

Organic Compound Layer

The organic compound layer may be formed by a single layer or a plurality of layers. If the organic compound layer includes a plurality of layers, the layers can be called a hole injection layer, a hole transport layer, an electron blocking layer, a light emitting layer, a hole blocking layer, an electron transport layer, and an electron injection layer in accordance with the functions of the layers. The organic compound layer is mainly formed from an organic compound but may contain inorganic atoms and an inorganic compound. For example, the organic compound layer may contain copper, lithium, magnesium, aluminum, iridium, platinum, molybdenum, zinc, or the like. The organic compound layer can be arranged between the first and second electrodes, and may be arranged in contact with the first and second electrodes.

Protection Layer

A protection layer may be provided on the cathode. For example, by adhering glass provided with a moisture absorbing agent on the cathode, permeation of water or the like into the organic compound layer can be suppressed and occurrence of display defects can be suppressed. Furthermore, as another embodiment, a passivation film made of silicon nitride or the like may be provided on the cathode to suppress permeation of water or the like into the organic compound layer. For example, the protection layer can be formed by forming the cathode, transferring it to another chamber without breaking the vacuum, and forming a silicon nitride film having a thickness of 2 µm by a CVD method. The protection layer may be provided using an atomic deposition method (ALD method) after forming a film using the CVD method. The material of the film by the ALD method is not limited but can be silicon nitride, silicon oxide, aluminum oxide, or the like. A silicon nitride film may further be formed by the CVD method on the film formed by the ALD method. The film formed by the ALD method may have a film thickness smaller than that of the film formed by the CVD method. More specifically, the film thickness of the film formed by the ALD method may be 50% or less, or 10% or less.

Color Filter

A color filter may be provided on the protection layer. For example, a color filter considering the size of the organic light emitting element may be provided on another substrate, and this substrate may be bonded to the substrate with the organic light emitting element provided thereon. Alternatively, a color filter may be patterned on the above-described protection layer using a photolithography technique. The color filter can be formed from a polymeric material.

Planarizing Layer

A planarizing layer may be provided between the color filter and the protection layer. The planarizing layer is provided to reduce unevenness of the lower layer. The planarizing layer may be called a material resin layer without limiting the purpose of the layer. The planarizing layer can be formed from an organic compound, and can be made of a low-molecular material or a polymeric material. However, a polymetric material is more suitable.

The planarizing layers may be provided above and below the color filter, and the same or different materials may be used for them. More specifically, examples of the material include polyvinyl carbazole resin, polycarbonate resin, polyester resin, ABS resin, acrylic resin, polyimide resin, phenol resin, epoxy resin, silicone resin, and urea resin.

Microlens

The organic light emitting device can include an optical member such as a microlens on the light emission side. The microlens can be made of acrylic resin, epoxy resin, or the like. The microlens can aim to increase the amount of light extracted from the organic light emitting device and control the direction of light to be extracted. The microlens can have a hemispherical shape. If the microlens has a hemispherical shape, among tangents contacting the hemisphere, there is a tangent parallel to the insulating layer, and the contact between the tangent and the hemisphere is the vertex of the microlens. The vertex of the microlens can be decided in the same manner even in an arbitrary sectional view. That is, among tangents contacting the semicircular of the microlens in a sectional view, there is a tangent parallel to the insulating layer, and the contact between the tangent and the semicircle is the vertex of the microlens.

Furthermore, the middle point of the microlens can also be defined. In the section of the microlens, a line segment from a point at which an arc shape ends to a point at which another arc shape ends is assumed, and the middle point of the line segment can be called the middle point of the microlens. A section for determining the vertex and the middle point may be a section perpendicular to the insulating layer.

Counter Substrate

A counter substrate can be provided on the planarizing layer. The counter substrate is called a counter substrate because it is provided at a position corresponding to the above-described substrate. The constituent material of the counter substrate can be the same as that of the above-described substrate. If the above-described substrate is the first substrate, the counter substrate can be the second substrate.

Organic Layer

The organic compound layer (hole injection layer, hole transport layer, electron blocking layer, light emitting layer, hole blocking layer, electron transport layer, electron injection layer, and the like) forming the organic light emitting element according to an embodiment of the present invention is formed by the method to be described below.

The organic compound layer forming the organic light emitting element according to the embodiment of the present invention can be formed by a dry process using a vacuum deposition method, an ionization deposition method, a sputtering method, a plasma method, or the like. Instead of the dry process, a wet process that forms a layer by dissolving a solute in an appropriate solvent and using a well-known coating method (for example, a spin coating method, a dipping method, a casting method, an LB method, an inkjet method, or the like) can be used.

Here, when the layer is formed by a vacuum deposition method, a solution coating method, or the like, crystallization or the like hardly occurs and excellent temporal stability is obtained. Furthermore, when the layer is formed using a coating method, it is possible to form the film in combination with a suitable binder resin.

Examples of the binder resin include polyvinyl carbazole resin, polycarbonate resin, polyester resin, ABS resin, acrylic resin, polyimide resin, phenol resin, epoxy resin, silicone resin, and urea resin. However, the binder resin is not limited to them.

One of these binder resins may be used singly as a homopolymer or a copolymer, or two or more of them may be used in combination. Furthermore, additives such as a well-known plasticizer, antioxidant, and an ultraviolet absorber may also be used as needed.

Pixel Circuit

The light emitting device can include a pixel circuit connected to the light emitting element. The pixel circuit may be an active matrix circuit that individually controls light emission of the first and second light emitting elements. The active matrix circuit may be a voltage or current programing circuit. A driving circuit includes a pixel circuit for each pixel. The pixel circuit can include a light emitting element, a transistor for controlling light emission luminance of the light emitting element, a transistor for controlling a light emission timing, a capacitor for holding the gate voltage of the transistor for controlling the light emission luminance, and a transistor for connection to GND without intervention of the light emitting element.

The light emitting device includes a display region and a peripheral region arranged around the display region. The light emitting device includes the pixel circuit in the display region and a display control circuit in the peripheral region. The mobility of the transistor forming the pixel circuit may be smaller than that of a transistor forming the display control circuit.

The slope of the current-voltage characteristic of the transistor forming the pixel circuit may be smaller than that of the current-voltage characteristic of the transistor forming the display control circuit. The slope of the current-voltage characteristic can be measured by a so-called Vg-Ig characteristic.

The transistor forming the pixel circuit is a transistor connected to the light emitting element such as the first light emitting element.

Pixel

The organic light emitting device includes a plurality of pixels. Each pixel includes sub-pixels that emit light components of different colors. The sub-pixels include, for example, R, G, and B emission colors, respectively.

In each pixel, a region also called a pixel opening emits light. This region is the same as the first region. The pixel opening can have a size of 5 μm (inclusive) to 15 μm (inclusive). More specifically, the pixel opening can have a size of 11 μm, 9.5 μm, 7.4 μm, 6.4 μm, or the like.

A distance between the sub-pixels can be 10 μm or less, and can be, more specifically, 8 μm, 7.4 μm, or 6.4 μm.

The pixels can have a known arrangement form in a plan view. For example, the pixels may have a stripe arrangement, a delta arrangement, a pentile arrangement, or a Bayer arrangement. The shape of each sub-pixel in a plan view may be any known shape. For example, a quadrangle such as a rectangle or a rhombus, a hexagon, or the like may be possible. A shape which is not a correct shape but is close to a rectangle is included in a rectangle, as a matter of course. The shape of the sub-pixel and the pixel arrangement can be used in combination.

Application of Organic Light Emitting Element of Embodiment of Present Invention The organic light emitting element according to an embodiment of the present invention can be used as a constituent member of a display device or an illumination device. In addition, the organic light emitting element is applicable to the exposure light source of an electrophotographic image forming device, the backlight of a liquid crystal display device, a light emitting device including a color filter in a white light source, and the like.

The display device may be an image information processing device that includes an image input unit for inputting image information from an area CCD, a linear CCD, a memory card, or the like, and an information processing unit for processing the input information, and displays the input image on a display unit.

In addition, a display unit included in an image capturing device or an inkjet printer can have a touch panel function. The driving type of the touch panel function may be an infrared type, a capacitance type, a resistive film type, or an electromagnetic induction type, and is not particularly limited. The display device may be used for the display unit of a multifunction printer.

Details will be described below with reference to FIGS. 5 to 11A and 11B.

Figure 5:
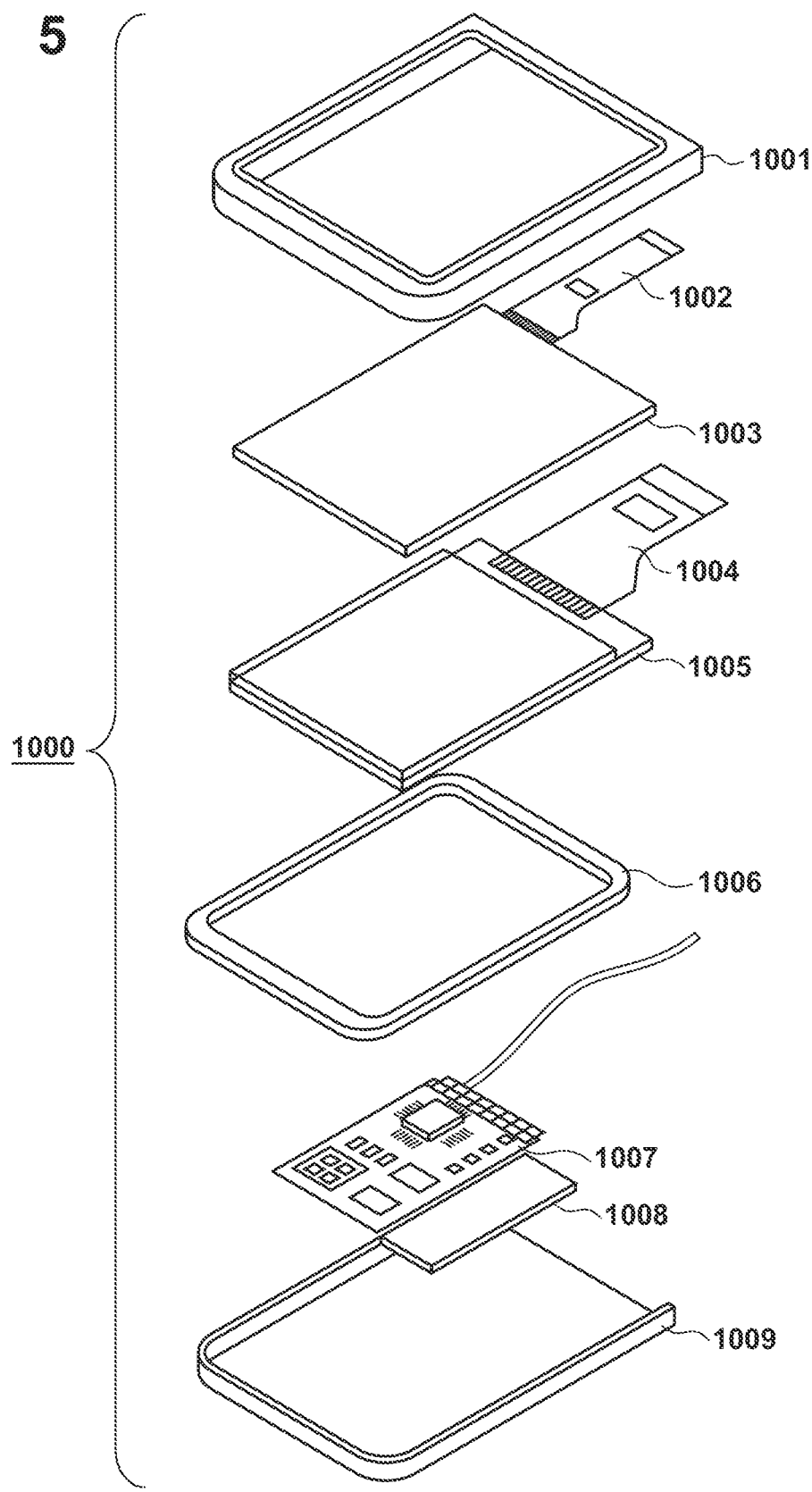
FIG. 5 is a view showing an example of a display device using the semiconductor device according to the embodiment.

FIG. 5 is a schematic view showing an example of the display device using the semiconductor device 800 or 800' functioning as the light emitting device of this embodiment. A display device 1000 can include a touch panel 1003, a display panel 1005, a frame 1006, a circuit board 1007, and a battery 1008 between an upper cover 1001 and a lower cover 1009. Flexible printed circuits (FPCs) 1002 and 1004 are respectively connected to the touch panel 1003 and the display panel 1005. Active elements such as transistors are arranged on the circuit board 1007. The battery 1008 is unnecessary if the display device 1000 is not a portable apparatus. Even when the display device 1000 is a portable apparatus, the battery 1008 need not be provided at this position. The semiconductor device 800 or 800' can be applied to the display panel 1005. The pixel region AA of the semiconductor device 800 or 800' functioning as the display panel 1005 is connected to the active elements such as transistors arranged on the circuit board 1007 and operates.

The display device 1000 shown in FIG. 5 can be used for a display unit of a photoelectric conversion device (image capturing device) including an optical unit having a plurality of lenses, and an image sensor for receiving light having passed through the optical unit and photoelectrically converting the light into an electric signal. The photoelectric conversion device can include a display unit for displaying information acquired by the image sensor. In addition, the display unit can be either a display unit exposed outside the photoelectric conversion device, or a display unit arranged in the finder. The photoelectric conversion device can be a digital camera or a digital video camera.

Figure 6:
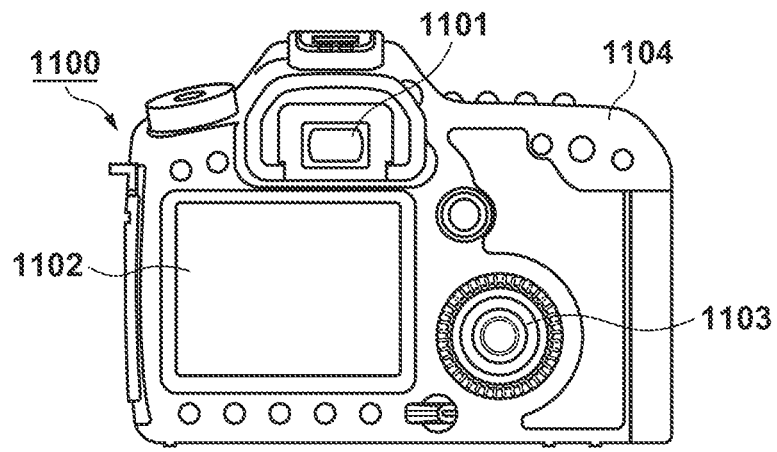
FIG. 6 is a view showing an example of a photoelectric conversion device using the semiconductor device according to the embodiment.

FIG. 6 is a schematic view showing an example of the photoelectric conversion device using the semiconductor device 800 or 800' functioning as the light emitting device of this embodiment. A photoelectric conversion device 1100 can include a viewfinder 1101, a rear display 1102, an operation unit 1103, and a housing 1104. The photoelectric conversion device 1100 can also be called an image capturing device. The semiconductor device 800 or 800' according to this embodiment can be applied to the viewfinder 1101 or the rear display 1102 as a display unit. In this case, the pixel region AA of the semiconductor device 800 or 800' can display not only an image to be captured but also environment information, image capturing instructions, and the like. Examples of the environment information are the intensity and direction of external light, the moving velocity of an object, and the possibility that an object is covered with an obstacle.

The timing suitable for image capturing is a very short time in many cases, so the information should be displayed as soon as possible. Therefore, the semiconductor device 800 or 800' functioning as the light emitting device containing the organic light emitting material such as an organic EL element in each pixel 70 may be used for the viewfinder 1101 or the rear display 1102. This is so because the organic light emitting material has a high response speed. The semiconductor device 800 or 800' functioning as the light emitting device using the organic light emitting material can be used for the apparatuses that require a high display speed more suitably than for the liquid crystal display device.

The photoelectric conversion device 1100 includes an optical unit (not shown). This optical unit has a plurality of lenses, and forms an image on a photoelectric conversion element (not shown) that receives light having passed through the optical unit and is accommodated in the housing 1104. The focal points of the plurality of lenses can be adjusted by adjusting the relative positions. This operation can also automatically be performed.

The semiconductor device 800 or 800' functioning as the light emitting device may be applied to a display unit of an electronic apparatus. At this time, the display unit can have both a display function and an operation function. Examples of the portable terminal are a portable phone such as a smartphone, a tablet, and a head mounted display.

Figure 7:
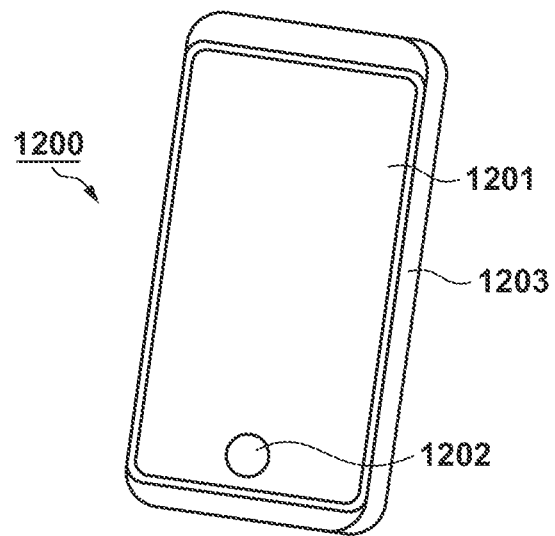
FIG. 7 is a view showing an example of an electronic apparatus using the semiconductor device according to the embodiment.

FIG. 7 is a schematic view showing an example of an electronic apparatus using the semiconductor device 800 or 800' functioning as the light emitting device of this embodiment. An electronic apparatus 1200 includes a display unit 1201, an operation unit 1202, and a housing 1203. The housing 1203 can accommodate a circuit, a printed board having this circuit, a battery, and a communication unit. The operation unit 1202 can be a button or a touch-panel-type reaction unit. The operation unit 1202 can also be a biometric authentication unit that performs unlocking or the like by authenticating the fingerprint. The portable apparatus including the communication unit can also be regarded as a communication apparatus. The semiconductor device 800 or 800' according to this embodiment can be applied to the display unit 1201.

Figure 8A:
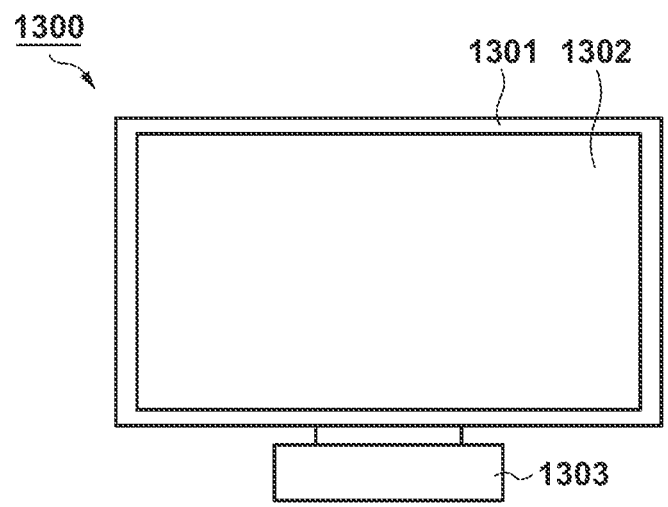
FIGS. 8A and 8B are views each showing an example of a display device using the semiconductor device according to the embodiment.
Figure 8B:
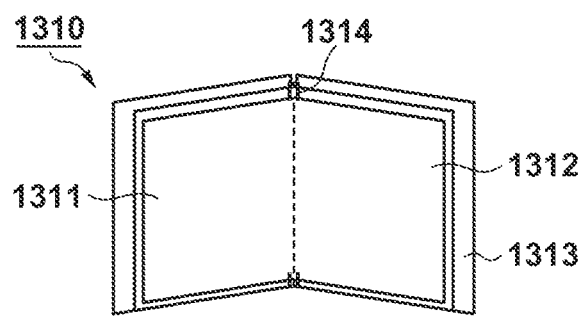

FIGS. 8A and 8B are schematic views showing examples of the display device using the semiconductor device 800 or 800' functioning as the light emitting device of this embodiment. FIG. 8A shows a display device such as a television monitor or a PC monitor. A display device 1300 includes a frame 1301 and a display unit 1302. The semiconductor device 800 or 800' according to this embodiment can be applied to the display unit 1302. The display device 1300 can include a base 1303 that supports the frame 1301 and the display unit 1302. The base 1303 is not limited to the form shown in FIG. 8A. For example, the lower side of the frame 1301 may also function as the base 1303. In addition, the frame 1301 and the display unit 1302 can be bent. The radius of curvature in this case can be 5,000 mm (inclusive) to 6,000 mm (inclusive).

FIG. 8B is a schematic view showing another example of the display device using the semiconductor device 800 or 800' functioning as the light emitting device of this embodiment. A display device 1310 shown in FIG. 8B can be folded, and is a so-called foldable display device. The display device 1310 includes a first display unit 1311, a second display unit 1312, a housing 1313, and a bending point 1314. The semiconductor device 800 or 800' according to this embodiment can be applied to each of the first display unit 1311 and the second display unit 1312. The first display unit 1311 and the second display unit 1312 can also be one seamless display device. The first display unit 1311 and the second display unit 1312 can be divided by the bending point. The first display unit 1311 and the second display unit 1312 can display different images, and can also display one image together.

Figure 9:
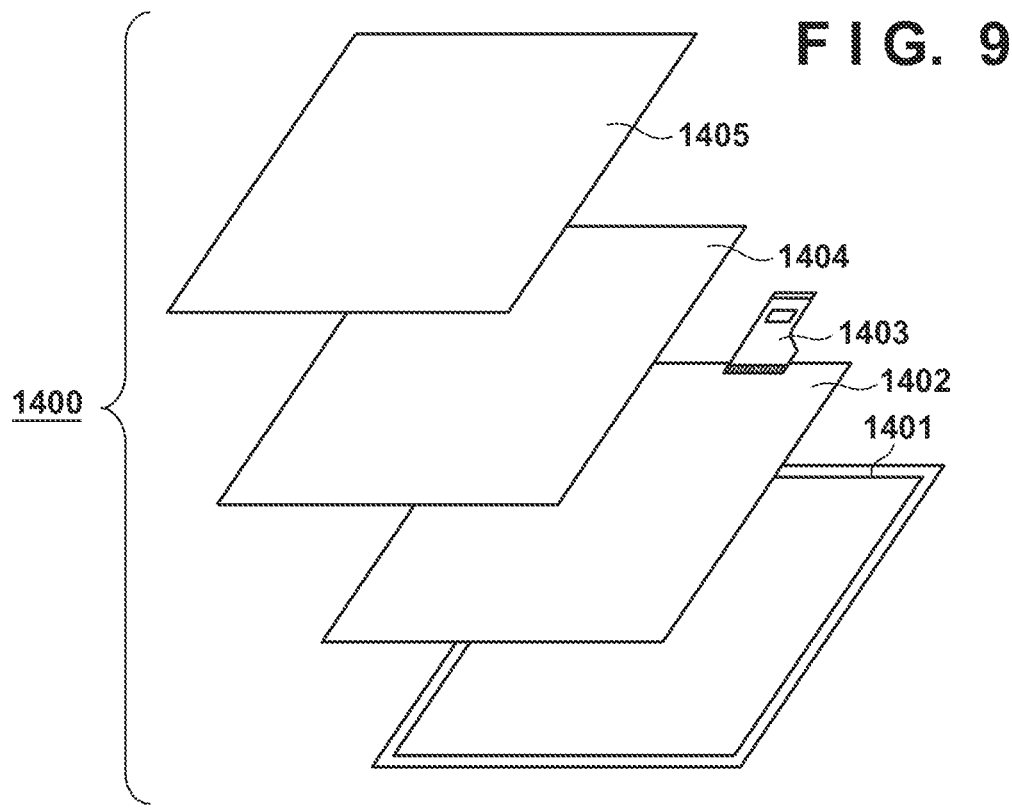
FIG. 9 is a view showing an example of an illumination device using the semiconductor device according to the embodiment.

FIG. 9 is a schematic view showing an example of the illumination device using the semiconductor device 800 or 800' functioning as the light emitting device of this embodiment. An illumination device 1400 can include a housing 1401, a light source 1402, a circuit board 1403, an optical film 1404, and a light diffusing unit 1405. The semiconductor device 800 or 800' according to this embodiment can be applied to the light source 1402. The optical film 1404 can be a filter that improves the color rendering of the light source. When performing lighting-up or the like, the light diffusing unit 1405 can throw the light of the light source over a broad range by effectively diffusing the light. The illumination device can also include a cover on the outermost portion, as needed. The illumination device 1400 can include both or one of the optical film 1404 and the light diffusing unit 1405.

The illumination device 1400 is, for example, a device for illuminating the interior of the room. The illumination device 1400 can emit white light, natural white light, or light of any color from blue to red. The illumination device 1400 can also include a light control circuit for controlling these light components. The illumination device 1400 can also include a power supply circuit connected to the pixel region AA of the semiconductor device 800 or 800' functioning as the light source 1402. The power supply circuit is a circuit for converting an AC voltage into a DC voltage. White has a color temperature of 4,200 K, and natural white has a color temperature of 5,000 K. The illumination device 1400 may also include a color filter. In addition, the illumination device 1400 can include a heat radiation unit. The heat radiation unit radiates the internal heat of the device to the outside of the device, and examples are a metal having a high specific heat and liquid silicon.

Figure 10:
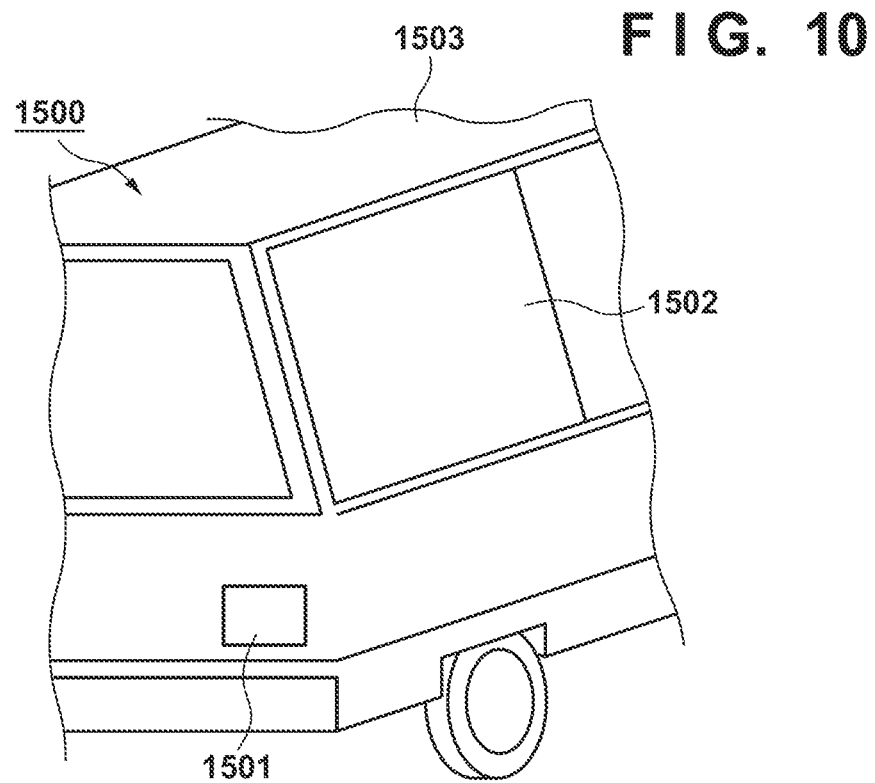
FIG. 10 is a view showing an example of a moving body using the semiconductor device according to the embodiment.

FIG. 10 is a schematic view of an automobile having a taillight as an example of a vehicle lighting appliance using the semiconductor device 800 or 800' functioning as the light emitting device of this embodiment. An automobile 1500 has a taillight 1501, and can have a form in which the taillight 1501 is turned on when performing a braking operation or the like. The semiconductor device 800 or 800' of this embodiment can be used as a headlight serving as a vehicle lighting appliance. The automobile is an example of a moving body, and the moving body may be a ship, a drone, an aircraft, a railroad car, an industrial robot, or the like. The moving body may include a main body and a lighting appliance provided in the main body. The lighting appliance may be used to make a notification of the current position of the main body.

The semiconductor device 800 or 800' functioning as the light emitting device according to this embodiment can be applied to the taillight 1501. The taillight 1501 can include a protection member for protecting the pixel region AA of the semiconductor device 800 or 800' functioning as the taillight 1501. The material of the protection member is not limited as long as the material is a transparent material with a strength that is high to some extent, and an example is polycarbonate. The protection member may be made of a material obtained by mixing a furandicarboxylic acid derivative, an acrylonitrile derivative, or the like in polycarbonate.

The automobile 1500 can include a vehicle body 1503, and a window 1502 attached to the vehicle body 1503. This window can be a window for checking the front and back of the automobile, and can also be a transparent display. For this transparent display, the semiconductor device 800 or 800' functioning as the light emitting device according to this embodiment may be used. In this case, the constituent materials of the electrodes and the like of the semiconductor device 800 or 800' are formed by transparent members.

Figure 11A:
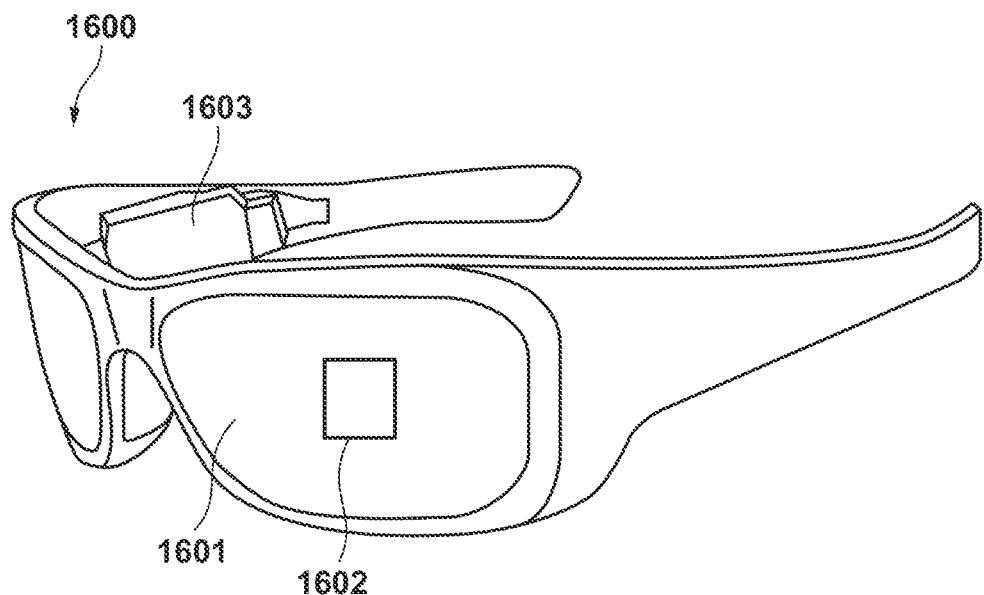
FIGS. 11A and 11B are views each showing an example of a wearable device using the semiconductor device according to the embodiment.
Figure 11B:
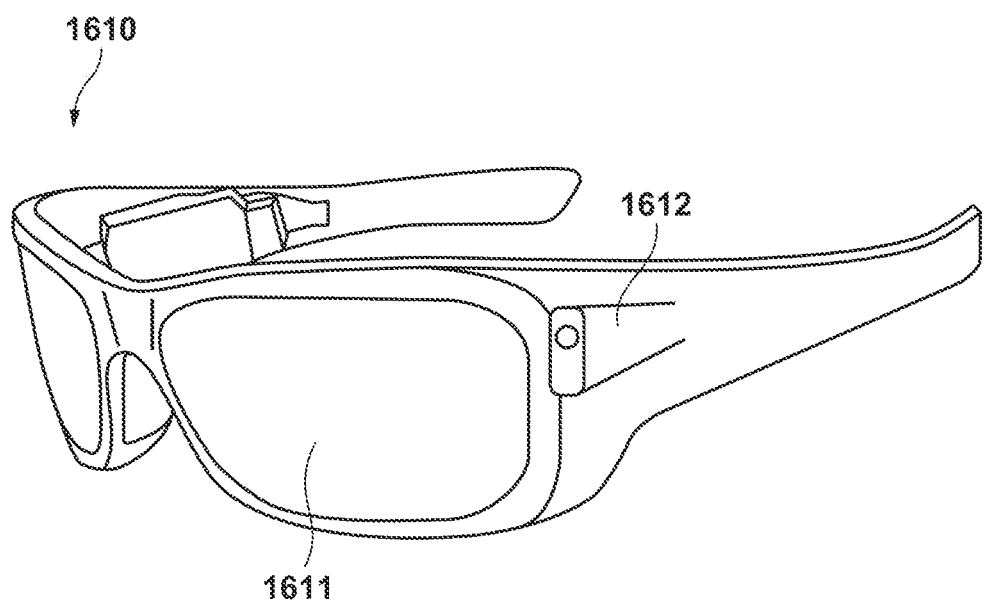

Further application examples of the semiconductor device 800 or 800' functioning as the light emitting device according to this embodiment will be described with reference to FIGS. 11A and 11B. The semiconductor device 800 or 800' functioning as the light emitting device can be applied to a system that can be worn as a wearable device such as smartglasses, a Head Mounted Display (HMD), or a smart contact lens. An image capturing display device used for such application examples includes an image capturing device capable of photoelectrically converting visible light and a light emitting device capable of emitting visible light.

Glasses 1600 (smartglasses) according to one application example will be described with reference to FIG. 11A. An image capturing device 1602 such as a CMOS sensor or an SPAD is provided on the surface side of a lens 1601 of the glasses 1600. In addition, the semiconductor device 800 or 800' functioning as the light emitting device according to this embodiment is provided on the back surface side of the lens 1601.

The glasses 1600 further include a control device 1603. The control device 1603 functions as a power supply that supplies electric power to the image capturing device 1602 and the semiconductor device 800 or 800' according to each embodiment. In addition, the control device 1603 controls the operations of the image capturing device 1602 and the semiconductor device 800 or 800'. An optical system configured to condense light to the image capturing device 1602 is formed on the lens 1601.

Glasses 1610 (smartglasses) according to one application example will be described with reference to FIG. 11B. The glasses 1610 include a control device 1612, and an image capturing device corresponding to the image capturing device 1602 and the semiconductor device 800 or 800' functioning as the light emitting device are mounted on the control device 1612. The image capturing device in the control device 1612 and an optical system configured to project light emitted from the semiconductor device 800 or 800' are formed in a lens 1611, and an image is projected to the lens 1611. The control device 1612 functions as a power supply that supplies electric power to the image capturing device and the semiconductor device 800 or 800', and controls the operations of the image capturing device and the semiconductor device 800 or 800'. The control device 1612 may include a line-of-sight detection unit that detects the line of sight of a wearer. The detection of a line of sight may be done using infrared rays. An infrared ray emitting unit emits infrared rays to an eyeball of the user who is gazing at a displayed image. An image capturing unit including a light receiving element detects reflected light of the emitted infrared rays from the eyeball, thereby obtaining a captured image of the eyeball. A reduction unit for reducing light from the infrared ray emitting unit to the display unit in a planar view is provided, thereby reducing deterioration of image quality.

The line of sight of the user to the displayed image is detected from the captured image of the eyeball obtained by capturing the infrared rays. An arbitrary known method can be applied to the line-of-sight detection using the captured image of the eyeball. As an example, a line-of-sight detection method based on a Purkinje image obtained by reflection of irradiation light by a cornea can be used.

More specifically, line-of-sight detection processing based on pupil center corneal reflection is performed. Using pupil center corneal reflection, a line-of-sight vector representing the direction (rotation angle) of the eyeball is calculated based on the image of the pupil and the Purkinje image included in the captured image of the eyeball, thereby detecting the line-of-sight of the user.

The semiconductor device 800 or 800' functioning as the light emitting device according to the embodiment of the present invention can include an image capturing device including a light receiving element, and control a displayed image based on the line-of-sight information of the user from the image capturing device.

More specifically, the semiconductor device 800 or 800' decides a first visual field region at which the user is gazing and a second visual field region other than the first visual field region based on the line-of-sight information. The first visual field region and the second visual field region may be decided by the control device of the semiconductor device 800 or 800', or those decided by an external control device may be received. In the display region of the semiconductor device 800 or 800', the display resolution of the first visual field region may be controlled to be higher than the display resolution of the second visual field region. That is, the resolution of the second visual field region may be lower than that of the first visual field region.

In addition, the display region includes a first display region and a second display region different from the first display region, and a region of higher priority is decided from the first display region and the second display region based on line-of-sight information. The first display region and the second display region may be decided by the control device of the semiconductor device 800 or 800', or those decided by an external control device may be received. The resolution of the region of higher priority may be controlled to be higher than the resolution of the region other than the region of higher priority. That is, the resolution of the region of relatively low priority may be low.

Note that AI may be used to decide the first visual field region or the region of higher priority. The AI may be a model configured to estimate the angle of the line of sight and the distance to a target ahead the line of sight from the image of the eyeball using the image of the eyeball and the direction of actual viewing of the eyeball in the image as supervised data. The AI program may be held by the semiconductor device 800 or 800', the image capturing device, or an external device. If the external device holds the AI program, it is transmitted to the semiconductor device 800 or 800' via communication.

When performing display control based on line-of-sight detection, smartglasses further including an image capturing device configured to capture the outside can be applied. The smartglasses can display captured outside information in real time.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-067819, filed Apr. 15, 2022, which is hereby incorporated by reference herein in its entirety.

What is claimed is:

1. A semiconductor device including an element substrate having a main surface provided with (a) a pixel region where a plurality of pixels are arranged and (b) a peripheral region where an alignment mark and a plurality of terminals are arranged, the device comprising:

an interlayer insulating layer arranged in the pixel region and the peripheral region;

a transparent insulating layer configured to cover the alignment mark and not to cover the plurality of terminals and each portion between the plurality of terminals, wherein the alignment mark and the plurality of terminals are arranged over and in contact with the interlayer insulating layer;

a wiring member including a plurality of electrodes respectively connected to the plurality of terminals; and a bonding member arranged between the plurality of terminals and the plurality of electrodes, wherein the transparent insulating layer and the bonding member do not overlap each other in orthogonal projection to the main surface.

2. The device according to claim 1, wherein the transparent insulating layer further covers the plurality of pixels.

3. The device according to claim 1, further comprising a plurality of sealing layers configured to cover the plurality of pixels, wherein the transparent insulating layer forms one of the plurality of sealing layers.

4. The device according to claim 2, wherein the transparent insulating layer is made of an inorganic material.

5. The device according to claim 2, further comprising a color filter layer configured to cover the plurality of pixels, wherein the transparent insulating layer is arranged between the plurality of pixels and the color filter layer.

6. The device according to claim 5, wherein the transparent insulating layer is made of a resin material.

7. A light emitting device comprising the semiconductor device according to claim 1, wherein each of a plurality of pixels includes a light emitting element.

8. A display device comprising the light emitting device according to claim 7, and an active element connected to the light emitting device.

9. A photoelectric conversion device comprising an optical unit including a plurality of lenses, an image sensor configured to receive light having passed through the optical unit, and a display unit configured to display an image, wherein the display unit displays an image captured by the image sensor, and includes the light emitting device according to claim 7.

10. An electronic apparatus comprising a housing provided with a display unit, and a communication unit provided in the housing and configured to perform external communication, wherein the display unit includes the light emitting device according to claim 7.

11. An illumination device comprising a light source, and at least one of a light diffusing unit and an optical film, wherein the light source includes the light emitting device according to claim 7.

12. A moving body comprising a main body, and a lighting appliance provided in the main body, wherein the lighting appliance includes the light emitting device according to claim 7.

13. The device according to claim 1, further comprising a transistor arranged in the pixel region, wherein the interlayer insulating layer is provided over the transistor.

14. The device according to claim 1, wherein in a direction perpendicular to a bottom surface of the alignment mark, a thickness of the alignment mark is smaller than a thickness of the transparent insulating layer.

15. A semiconductor device including an element substrate having a main surface provided with (a) a pixel region where a plurality of pixels are arranged and (b) a peripheral region where an alignment mark and a plurality of terminals are arranged, the device comprising:

a light shielding member surrounding an outer edge of the alignment mark in orthogonal projection to the main surface, wherein at least a part of the alignment mark is not overlapped with the light shielding member; and a transparent insulating layer configured to cover the alignment mark and not to cover the plurality of terminals and each portion between the plurality of terminals, wherein the transparent insulating layer is arranged in a layer between the alignment mark and the light shielding member.

16. The device according to claim 15, wherein in the peripheral region, a plurality of wiring patterns are arranged in a layer between the main surface and the alignment mark.

17. The device according to claim 15, further comprising a color filter layer configured to cover the plurality of pixels, wherein the color filter layer includes color filters of a plurality of colors, and wherein a color filter of at least one color among the color filters of the plurality of colors functions as the light shielding member.

18. The device according to claim 17, wherein the light shielding member includes, among the color filters of the plurality of colors, a color filter configured to transmit blue light.

19. The device according to claim 15, wherein the light shielding member contains a black resin.

20. The device according to claim 15, wherein the light shielding member contains titanium nitride.

21. A semiconductor device including an element substrate having a main surface provided with (a) a pixel region where a plurality of pixels are arranged and (b) a peripheral region where an alignment mark and a plurality of terminals are arranged, the device comprising:

an interlayer insulating layer arranged in the pixel region and the peripheral region; and a transparent insulating layer configured to cover the alignment mark and not to cover the plurality of terminals and each portion between the plurality of terminals, wherein the alignment mark and the plurality of terminals are arranged over and in contact with the interlayer insulating layer, and wherein in a direction perpendicular to a bottom surface of the alignment mark, a thickness of the alignment mark is smaller than a thickness of the transparent insulating layer.

* * * * *